(12) United States Patent
Yang

(10) Patent No.: US 7,102,230 B2
(45) Date of Patent: Sep. 5, 2006

(54) CIRCUIT CARRIER AND FABRICATION METHOD THEREOF

(75) Inventor: Chih-An Yang, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/993,455

(22) Filed: Nov. 18, 2004

(65) Prior Publication Data

US 2005/0263887 A1 Dec. 1, 2005

(30) Foreign Application Priority Data

May 31, 2004 (TW) .............................. 93115461 A

(51) Int. Cl.
*H01L 23/48* (2006.01)
(52) U.S. Cl. ................ 257/738; 257/697; 257/690; 257/778; 257/779; 257/781; 257/775; 257/692
(58) Field of Classification Search ................ 257/738, 257/697, 690, 692, 779, 778, 781, 775
See application file for complete search history.

(56) References Cited

U.S. PATENT DOCUMENTS

| 6,543,676 B1 * | 4/2003 | Tung et al. .................. 228/215 |
| 6,720,500 B1 * | 4/2004 | Inoue .......................... 174/258 |
| 6,911,726 B1 * | 6/2005 | Rumer et al. ................ 257/697 |

* cited by examiner

*Primary Examiner*—Eddie C. Lee
*Assistant Examiner*—Junghwa Im
(74) *Attorney, Agent, or Firm*—J.C. Patents

(57) ABSTRACT

A circuit carrier adapted for a pin grid array (PGA) package is disclosed. The circuit carrier comprises a substrate, at least one pin pad, at least one solder mask layer, at least one solder layer, at least one pin and a fixing layer. The pin pad is disposed over the surface of the substrate. The solder mask layer is disposed over the surface of the substrate, and exposing at least a portion of the pin pad. The solder layer is disposed over the pin pad. One end of the pin connects to the pin pad through the solder layer. The fixing layer is disposed over the solder mask layer, and covering the solder layer and a portion of a side surface of the pin. When the solder layer melts due to a high process temperature, the fixing layer helps to fix the pin to the pin pad.

10 Claims, 2 Drawing Sheets

CIRCUIT CARRIER AND FABRICATION METHOD THEREOF

CROSS-REFERENCE TO RELATED APPLICATION

This application claims the priority benefit of Taiwan application Ser. No. 93115461, filed on May 31, 2004.

BACKGROUND OF THE INVENTION

1. Field of the Invention

The present invention relates to a circuit carrier, and more particularly to a circuit carrier adapted for a pin grid array (PGA) package.

2. Description of the Related Art

Due to advance of technology, a variety of electronic products have been developed. These electronic products with multiple functions are more portable and available for users, and have small sizes. Circuit carriers have been widely used in circuit layout for these electronic products. The circuit carrier can be, for example, printed circuit boards (PCB) or IC substrates. The circuit carrier is composed of a plurality of patterned circuit layers and a plurality of dielectric layers that are alternatively stacked with each other. Each dielectric layer is disposed between two patterned circuit layers. These patterned circuit layers are connected to each other with plated through holes (PTH) or micro vias. Due to having high layout density, convenient package process and high electrical performance, the circuit carrier has been popularly applied to various electrical packages like ball grid array (BGA) package or PGA package.

FIG. 1 is a cross sectional view showing a conventional Flip Chip (FC)/PGA package. The package adopts a surface mounting technology (SMT) pinning technology. The FC/PGA package comprises a circuit carrier 100 and a chip 180. The circuit carrier 100 comprises a substrate 110, at least one pin pad 120, a solder mask layer 140, at least one pin 150 and at least one solder layer 160. The pin pad 120 is disposed over the surface 112 of the substrate 110. The solder layer 140 is disposed over the surface 112 of the substrate 110, having at least one solder mask opening 140a for exposing the pin pad 120. One end of the pin 150 connects to the pin pad 120 through the solder layer 160. The chip 180 connects to the surface 114 of the substrate 110 via the bumps 170. An underfill 190 is filled between the chip 180 and the substrate 110.

SMT has been used to connect two devices. The solder layer usually comprises Sn/Pb alloy because of its good soldering properties. By the concern of environmental pollution caused by Pb, some countries will forbid the use of Sn/Pb alloy and replace it by lead free solder in the near future. The reflow temperature for the lead free solder is higher than that for lead containing solder, such as Sn/Pb alloy. The change will impact reliabilities of electronic devices bonded with SMT.

Referring to FIG. 1, the bumps 170 comprise lead free solder and the pin 150 is fixed to the pin pad 120 with the solder layer 160, which is a lead free solder, too. In order to melt the bumps 170 or the pre-solders thereunder, the reflow temperature is about 260° C. When the reflow temperature is higher than the melting point of the solder layer 160, the solder layer 160 melts and the pin 150 cannot be fixed to the pin pad 120 due to the melting of the solder layer 160. Without the help of the solder layer 160, the shift or disposition of the pin 150 occurs. As a result, the yield of manufacturing the electrical package declines.

SUMMARY OF THE INVENTION

Accordingly, the present invention provides a circuit carrier and a fabrication thereof adapted for a pin grid array (PGA) package. By integrating the circuit carrier and the fabrication process in the PGA package process, the yield of manufacturing PGA package is enhanced.

The present invention also provides an electrical package and a fabrication method thereof adapted for a PGA package for maintaining the yield of manufacturing the PGA package.

The present invention discloses a circuit carrier adapted for a PGA package. The circuit carrier comprises a substrate, at least one pin pad, at least one solder mask layer, at least one solder layer, at least one pin and a fixing layer. The pin pad is disposed over the surface of the substrate. The solder mask layer is disposed over the surface of the substrate, exposing at least a portion of the pin pad. The solder layer is disposed over the pin pad. One end of the pin connects to the pin pad through the solder layer. The fixing layer is disposed over the solder mask layer, covering the solder layer and a portion of a side surface of the pin.

The present invention discloses a fabrication method of a circuit carrier adapted for a PGA package. The fabrication method of the circuit carrier comprises at least the following steps. A circuit carrier first is provided. The circuit carrier comprises a substrate, at least one pin pad, at least one solder mask layer, at least one solder layer and at least one pin. The pin pad is disposed over the surface of the substrate. The solder mask layer is disposed over the surface of the substrate, exposing at least a portion of the pin pad. The solder layer is disposed over the pin pad. One end of the pin connects to the pin pad through the solder layer. The method then forms a fixing layer over the solder mask layer, covering the solder layer and a portion of a side surface of the pin.

The present invention further discloses a PGA package. The PGA package comprises a circuit carrier and an electronic device. The circuit carrier comprises a substrate, at least one pin pad, at least one solder mask layer, at least one solder layer, at least one pin and a fixing layer. The pin pad is disposed over the surface of the substrate. The solder mask layer is disposed over the surface of the substrate, exposing at least a portion of the pin pad. The solder layer is disposed over the pin pad. One end of the pin connects to the pin pad through the solder layer. The fixing layer is disposed over the solder mask layer, covering the solder layer and a portion of a side surface of the pin. The electronic device is disposed over the first or the second surface of the substrate and electrically connected to the circuit carrier.

The present invention finally discloses a fabrication method of a PGA package. The fabrication method of the PGA package comprises at least the following steps. A circuit carrier first is provided. The circuit carrier comprises a substrate, at least one pin pad, at least one solder mask layer, at least one solder layer and at least one pin. The pin pad is disposed over the surface of the substrate. The solder mask layer is disposed over the surface of the substrate, exposing at least a portion of the pin pad. The solder layer is disposed over the pin pad. One end of the pin connects to the pin pad through the solder layer. The method then forms a fixing layer over the solder mask layer, covering the solder layer and a portion of a side surface of the pin. The electronic device is disposed over the surface or another surface of the substrate and electrically connected to the circuit carrier.

According to the circuit carrier and the fabrication method thereof, the fixing layer is formed over the surface of the substrate, covering the solder layer and the portion of the side surface of the pin. When the process temperature, such as reflow temperature, or operational temperature of the circuit carrier is higher than the melting point of the solder layer, the pin is still fixed to the pin pad even if the solder layer melts and cannot fix the pin. The fixing layer can avoid the shift or disposition of the pin. With the fixing layer, the yield of manufacturing the circuit carrier of the PGA package is improved.

In order to make the aforementioned and other objects, features and advantages of the present invention understandable, a preferred embodiment accompanied with figures is described in detail below.

DESCRIPTION OF SOME EMBODIMENTS

Figure 1:
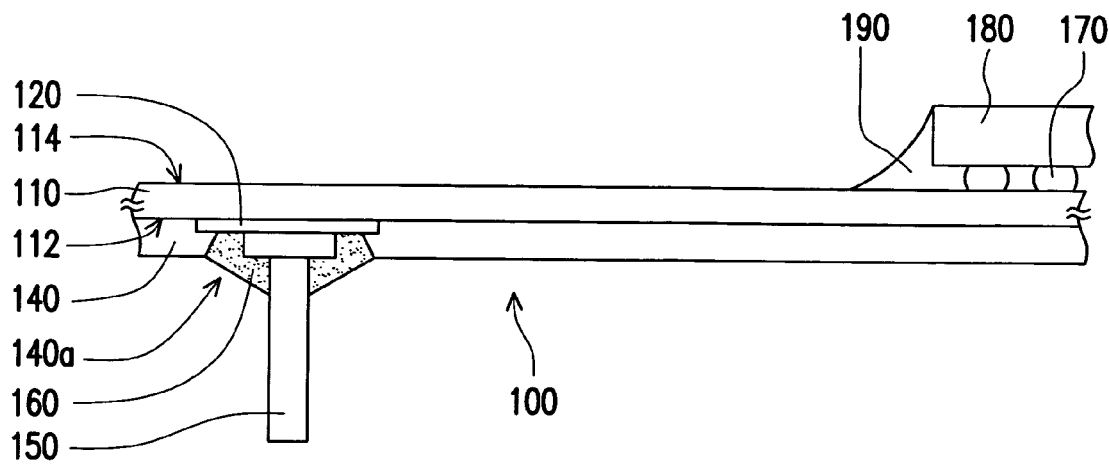
FIG. 1 is a cross sectional view showing a conventional Flip Chip (FC)/PGA package.
Figure 2A:
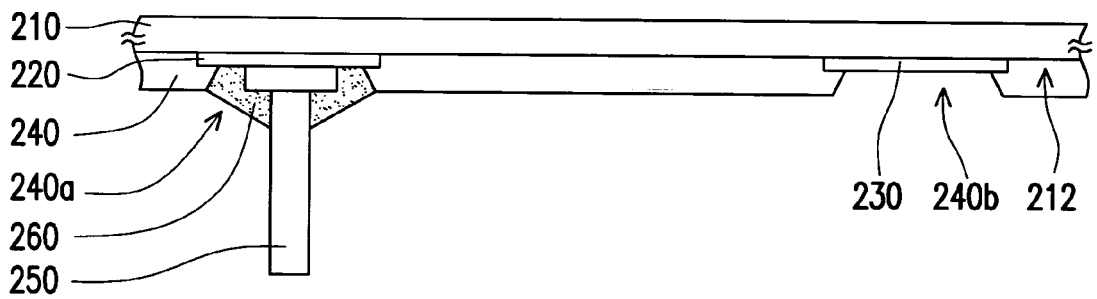
FIGS. 2A–2C is progression steps showing a fabrication method of a circuit carrier according to an embodiment of the present invention.
Figure 2B:
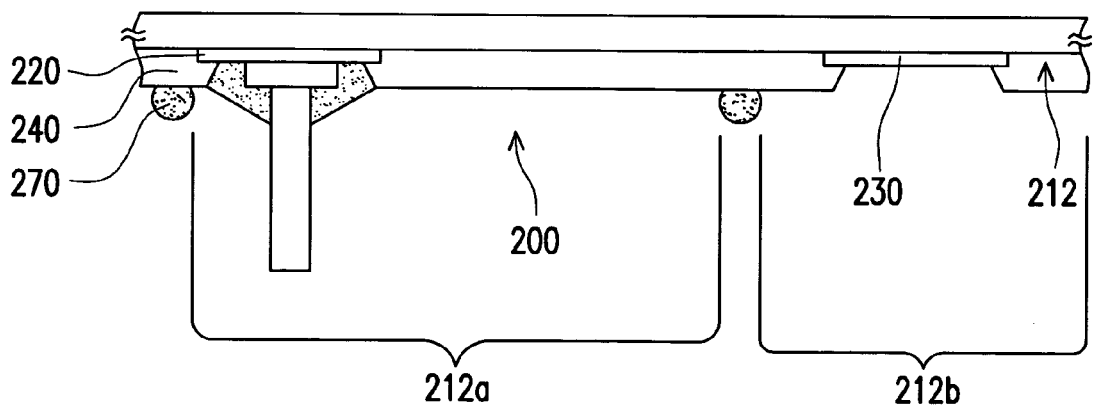
Figure 2C:
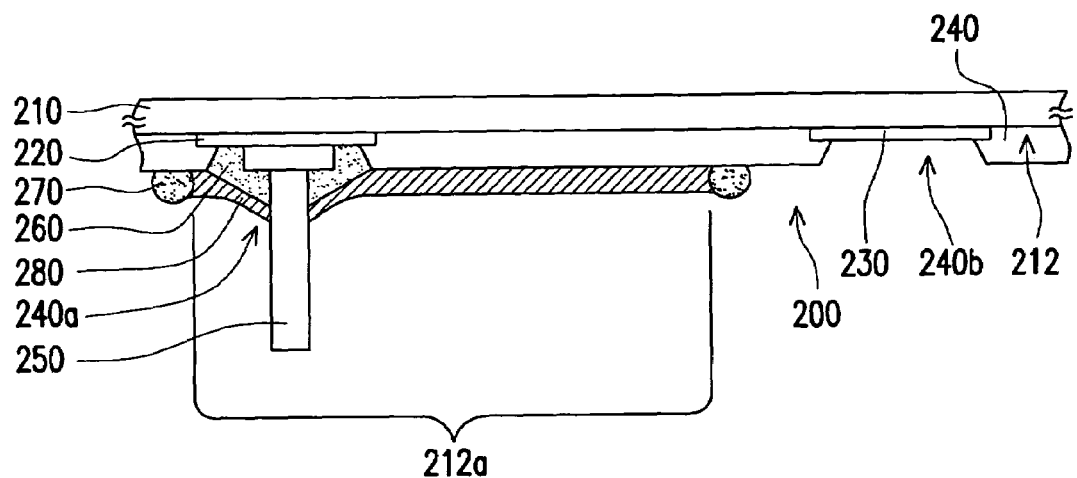

FIGS. 2A–2C is progression steps showing a fabrication method of a circuit carrier according to an embodiment of the present invention. Referring to FIG. 2A, a circuit carrier 200 is provided and adapted for a PGA package. The circuit carrier 200 comprises a substrate 210, at least one pin pad 220, at least one electrode pad 230, at least one solder mask layer 240, at least one pin 250 and at least one solder layer 260. The pin pad 220 and the electrode pad 230 are disposed over the surface 212 of the substrate 210, and may be a portion of an outer patterned circuit layer (not shown) of the substrate 210. The solder mask layer 240 is disposed over the surface 212 of the substrate 210, and comprises a plurality of solder mask openings 240a and 240b for exposing the pin pad 220 and the electrode pad 230 respectively. The solder layer 260 is disposed over the pin pad 220, and covers the pin pad 220 and a portion of a side surface of the pin 250. One end of the pin 250 connects to the pin pad 220 by the solder layer 260.

Referring to FIG. 2B, a patterned barrier layer 270 is formed over the solder mask layer 240. The patterned barrier layer 270 prevents a subsequent fixing layer 280 (shown in FIG. 2C) from covering the electrode pad 230. The patterned barrier layer 270 can be, for example, a rib surrounding the pin pad 220 so as to divide the surface 212 of the substrate 210 into two areas 212a and 212b. The pin pad 220 is in the area 212a. The electrode pad 230 is not in the area 212a, but in the area 212b. The patterned barrier layer 270 may be provided when the circuit carrier 200 is provided in FIG. 2A. Accordingly, forming the patterned barrier layer 270 in FIG. 2B is not necessarily required.

Referring to FIG. 2C, a fixing layer 280 is formed over the area 212a of the surface 212 of the substrate 210, and covers the solder layer 260 and a portion of the side surface of the pin 250. After the fixing layer 280 is cured, the fabrication of the circuit carrier 200 is completed. The material of the fixing layer 280 comprises, for example, epoxy resin. The method of forming the fixing layer 280 comprises, for example, coating or dispensing.

Figure 3:
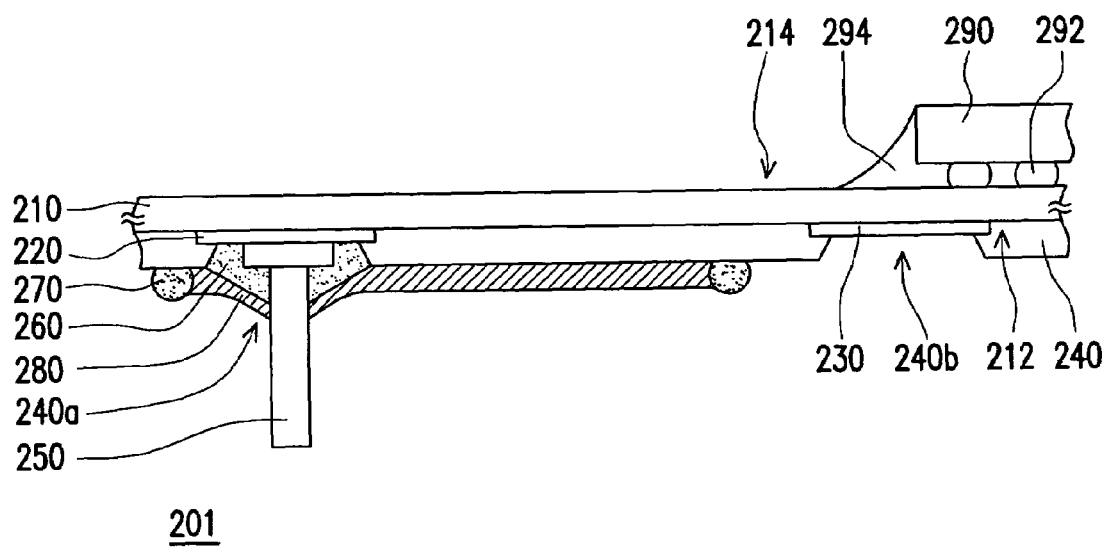
FIG. 3 is a schematic cross sectional view showing a circuit carrier applied to a PGA package according to an embodiment of the present invention.

When the circuit carrier is applied to a PGA package process, the circuit carrier connects to at least one electronic device. FIG. 3 is a schematic cross sectional view showing a circuit carrier applied to a PGA package according to an embodiment of the present invention. Referring to FIG. 3, after forming the circuit carrier 200 of FIG. 2C, an electronic device 290, such as a chip, is disposed on the surface 214 of the substrate 210. For example, the electronic device 290 connects to the substrate 210 by a Flip Chip bonding method or a wire bonding method. The Flip Chip bonding method connects the electronic device 290 to the substrate 210 with a plurality of bumps 292. The electronic device 290 can be, for example, an integrated circuit (IC) chip or a passive device. The passive device can be, for example, a capacitor, an inductor or a resistor. An underfill 294 is then filled between the electronic device 290 and the substrate 210 for completing the fabrication of the electrical package 201. In the electrical package 201, the electronic device 290 is electrically connected to the pin 250 by an inner circuit of the substrate 210.

In order to bond the bumps 292 to contact points (not shown) of the substrate 210, the bumps 292 or pre-solders under the bumps 292 melt for connecting the bumps 292 to the contact points of the substrate 210. When the bumps 292 or the pre-solders under the bumps 292 are made of lead free material, such as Sn/Sb alloy or Sn/Ag/Cu alloy, the reflow temperature of the lead free material is about 260° C. When the reflow temperature is higher than the melting point of the solder layer 260, the solder layer 260 melts and the pin 220 cannot be fixed to the pin pad 250. The fixing layer 280 then performs the fixing function for the solder layer 260, temporarily fixing the pin 250 to the pin pad 220 until the solder layer 260 solidifies. When the solder layer 260 melts, the fixing layer 280 prevents the shift or disposition of the pin 250 relative to the pin pad 220. Accordingly, the yield of manufacturing the PGA package 201 is improved.

One of ordinary skill in the art knows that if the circuit carrier of the present invention does not connect to a passive device, the electrode pad is not required. The patterned barrier layer is also not required. In the exemplary fabrication process of the circuit carrier, it is not necessary to apply the patterned barrier layer during the fabrication process. The fixing layer can be pre-defined on the surface of the substrate to avoid the step of forming the patterned barrier layer.

According to the circuit carrier and the fabrication method thereof, the fixing layer is formed over the surface of the substrate, and covers the solder layer and the portion of the side surface of the pin. When the process temperature, such as reflow temperature, or operational temperature of the circuit carrier is higher than the melting point of the solder layer, the pin is still fixed to the pin pad even if the solder layer melts and cannot fix the pin. The fixing layer can avoid the shift or disposition of the pin relative to the pin pad. With the fixing layer, the yield of manufacturing the PGA package of the circuit carrier is improved. After forming the PGA package, the pin can still be fixed to the pin pad even if the package is subject to high temperature environment. When the solder layer fixing the pin to the pin pad melts, the fixing layer can help to fix the pin to the pin pad.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A circuit carrier adapted for a pin grid array (PGA) package, the circuit carrier comprising:
   a substrate comprising a surface;
   at least one pin pad disposed over the surface of the substrate;
   at least one solder mask layer disposed over the surface of the substrate, and exposing at least a portion of the pin pad;
   at least one solder layer disposed over the pin pad;
   at least one pin, one end of the pin connecting to the pin pad through the solder layer;
   a fixing layer disposed over the solder mask layer, and covering the solder layer and a portion of a side surface of the pin;
   at least one electrode pad disposed on the surface of the substrate, wherein the solder mask layer exposes at least a portion of the electrode pad; and
   a patterned barrier layer disposed over the solder mask layer, the patterned barrier layer exposing a first area and a second area of the surface of the substrate, wherein the pin pad is disposed in the first area, the electrode pad is not disposed in the first area, but in the second area, and the fixing layer is disposed in the first area of the surface of the substrate.

2. The circuit carrier of claim 1, wherein the material of the fixing layer comprises epoxy resin.

3. The circuit carrier of claim 1, wherein the solder layer comprises lead containing solder or lead free solder.

4. The circuit carrier of claim 1, wherein the solder layer comprises Sn/Sb alloy or Sn/Ag/Cu alloy.

5. A pin grid array (PGA) package, comprising:
   a circuit carrier comprising:
      a substrate comprising a first and a second surfaces;
      at least one pin pad disposed over the first surface of the substrate;
      at least one solder mask layer disposed over the first surface of the substrate, and exposing at least a portion of the pin pad;
      at least one solder layer disposed over the pin pad;
      at least one pin, one end of the pin connecting to the pin pad through the solder layer;
      at least one electrode pad disposed over the first surface of the substrate, the solder mask Layer exposes at least a portion of the electrode pad; and
      a patterned barrier layer disposed over the solder mask layer, the patterned barrier layer exposing a first area and a second area of the first surface of the substrate, wherein the pin pad is disposed in the first area, the electrode pad is not disposed in the first area, but in the second area, and the fixing layer is disposed in the first area of the first surface of the substrate;
   at least one fixing layer disposed over the solder mask layer, and covering the solder layer and a portion of a side surface of the pin; and
   at least one electronic device disposed over the first or the second surface of the substrate, the electronic device electrically connected to the electrode pad of the circuit carrier.

6. The pin grid array (PGA) package of claim 5, wherein the material of the fixing layer comprises epoxy resin.

7. The pin grid array (PGA) package of claim 5, wherein the solder layer comprises lead containing solder or lead free solder.

8. The pin grid array (PGA) package of claim 5, wherein the solder layer comprises Sn/Sb alloy or Sn/Ag/Cu alloy.

9. The pin grid array (PGA) package of claim 5, wherein the electronic device comprises an integrated circuit chip or a passive device.

10. The pin grid array (PGA) package of claim 5, wherein connecting the electronic device to the circuit carrier is a Flip Chip bonding or a wire bonding.

* * * * *